United States Patent [19]

Rotem et al.

[11] Patent Number: 4,871,967
[45] Date of Patent: Oct. 3, 1989

[54] SPECTRAL COMPONENT SEPARATION IN MR IMAGING

[75] Inventors: Haim Rotem, Moshav Rishpon; Yair Shimoni, Jerusalem, both of Israel

[73] Assignee: Elscint Ltd., Haifa, Israel

[21] Appl. No.: 125,533

[22] Filed: Nov. 25, 1987

[30] Foreign Application Priority Data

Nov. 30, 1986 [IL] Israel ........................................ 80814

[51] Int. Cl.$^4$ ............................................ G01R 33/20
[52] U.S. Cl. ...................................... 324/309; 324/307
[58] Field of Search ................ 324/307, 309, 310, 312

[56] References Cited

U.S. PATENT DOCUMENTS 4,661,775  4/1987  Kormos et al. ...................... 324/307
4,720,679  1/1988  Patrick et al. ....................... 324/309

OTHER PUBLICATIONS

"Simple Proton Spectroscopic Imaging" by W. T. Dixon (vol. 153, 1984, pp. 189–194).

Primary Examiner—Tom Noland
Assistant Examiner—Louis M. Arana
Attorney, Agent, or Firm—Sandler & Greenblum

[57] ABSTRACT

A method and system for using magnetic resonance imaging (MRI) to acquire separate data contributions from first and second spectral components by causing a 90 degree phase difference between the data of said components in a first of at least two echoes and using the two echoes to determine the approximate $\Delta\phi$ delay due to inhomogeneity, determining linear phase delay $\beta$ and using $\Delta\phi$ and $\beta$ in the calculation of the separated data contributions of each of the spectral components.

12 Claims, 4 Drawing Sheets

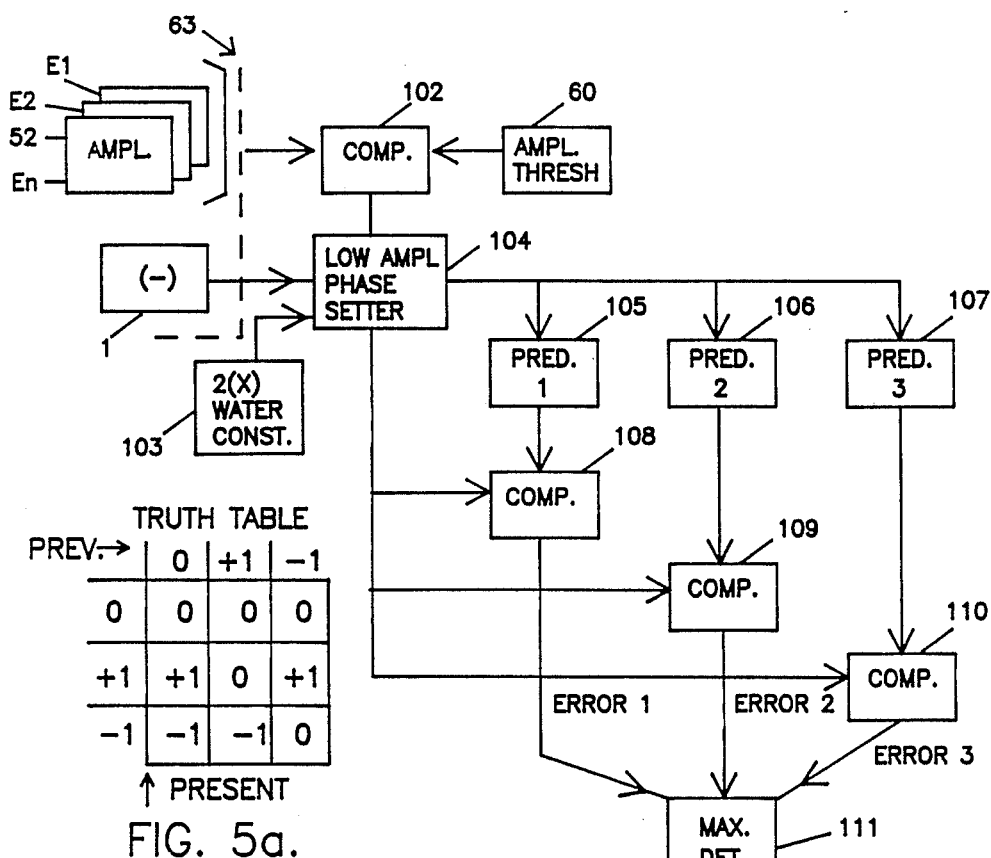
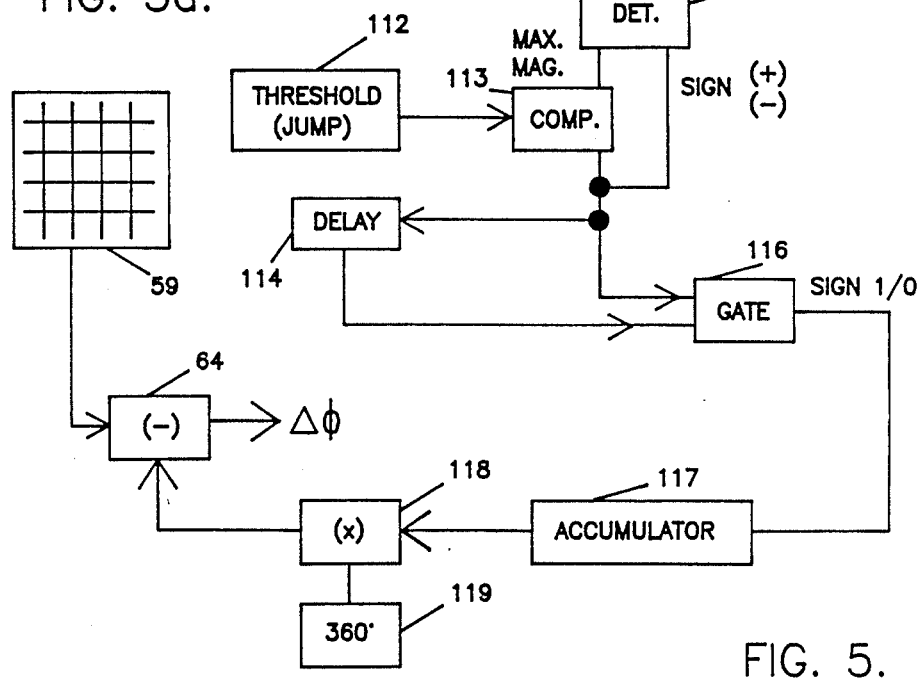
FIG. 5a.
FIG. 5.

4,871,967

SPECTRAL COMPONENT SEPARATION IN MR IMAGING

FIELD OF THE INVENTION

This invention is concerned with magnetic resonance imaging (MRI) systems and more particularly with the use of such systems to obtain separate images of different spectral components such as water and lipids in a sample using a single scan. This is an improvement over the invention of U.S. Pat. No. 4,714,885 which was issued on Dec. 22, 1987, and is assigned to the assignee of this invention.

BACKGROUND OF THE INVENTION

One of the criteria for imaging systems is the amount of throughput that can be obtained; that is, the number of patients that can be processed and from which complete data can be obtained in a given amount of time. Any thing that can be done to increase thoroughput, that is decrease the time required to obtain data from the patient is a plus as long as the data that is acquired is useful and as long as there is not increased risk of any kind, or increased discomfort to the patient during the scan.

Presently, separate images of two different spectral components such as water and lipids within the patient are sometimes obtained. The separate images are important for diagnostic purposes; since they supply the user with chemical information in addition to the morphological or anatomical information of conventional imaging. Moreover by using an appropriate shift of one image with respect to the other the two images can be combined resulting in an image free of chemical shift artifacts. However, until the above mentioned invention to obtain the separate images at least two scans of the patient were required; i.e., two imaging cycles such as spin echo cycles had to be processed to obtain the two images.

A unique pair of interelated sequences to obtain information on water and/or lipids in a patient was described in an article appearing in Radiology, entitled "Simple Proton Spectroscopic Imaging" by W. T. Dixon (Vol. 153, 1984, pp 189-194). In that article a method for encoding spectroscopic information into clinical images is explained. The image produced differentiates between the water and fat intensities. The method requires using a normal spin echo sequence in which the Hahn and gradient echoes coincide. In addition each excitation is repeated with the Hahn echo shifted by an appropriate interval. More particularly, the 180 degree Rf pulse is shifted by a time T to shift the Hahn echo with respect to the gradient echo an amount sufficient to cause the chemical shift between the echoes of water and lipids to be 180 degrees out of phase at the gradient echo time. The image produced with the described sequence clearly indicates the differences between the signals due to water and the signals due to fat.

By obtaining normal spin echo derived image data in addition to obtaining modified spin echo image data, the two images can be constructed. Thus, the described method enables imaging two spectral components in a single image corrected for the chemical shift artifact or obtaining separate images of each of two spectral components.

A disadvantage of the described method is the amount of time required for obtaining the data for imaging. More particularly, two scans are required to obtain the two images. It is worth noting that even with two scans no inhomogeneity data is acquired by the Dixon method. Any reduction in this amount of time required to obtain the images of each of the two spectral components would be advantageous and a sought after goal.

An object of the invention of the above referred to patent application was to obtain separate data contributions from first and second spectral components sufficient to construct an image for each of the components with a single magnetic resonance scan; thus, cutting the scan time of Dixon by at least one half. The objective was obtained by causing there to be a 90 degree phase shift between the water and lipid in the time for acquiring the echo signal.

As used herein scan time is the time required to apply all of the excitation pulses and gradient pulses to enable acquiring sufficient data to construct an image of a selected volume of a sample being imaged. A single scan is the mininmal Rf signal transmitting and receiving repetitions required to acquire the data for an image of a single spectral component having the desired spatial resolution and signal-to-noise ratio.

The invention of the previous application and the improvement thereover of this application may be better understood when considering the mathematics of the data acquisition of the two spectral components.

In complex spectral notation:

$$Es = Ew + Ew + i\, El$$

where:
Es is the total echo signal received,
Ew is the water component of the total echo signal,
El is the lipid component of the total echo signal, and
i is an operator indicating El is an imaginary number.
The complex notion transforms in the image (space) domain into:

$$Is = Iw + i\, Il$$

where:
Is is the total complex amplitude of the signal in each pixel,
Iw is the water component of the total amplitude in each pixel, and
Il is the lipid components of the total amplitude in each pixel.
In complex polar notation:

$$Is = Io\, e^{-i\psi}$$

where:
Io is the magnitude of the image per pixel (after the Fourier Transform)
$\psi$ is the ideal phase angle between the water component and the vector resultant of the two spectral components of the signal in each pixel.

According to the invention of the prior application the angle between the water and lipid components was set to be 90 degrees. To account for linear phase contributions and phase contributions due to inhomogeneities and the like, a calibration measurement was made pixel by pixel using a pure water phantom. Then the separate water and lipid contributions were computed.

The above inventive method works fine for many experiments, it however failed to account for phase delays due to inhomogeneities caused by the object being sampled. Thus, the inhomogeneity of the field Bo in the sample is different than the inhomogeneity of the field Bo in the water phantom. The problem was how to account for the phase delay $\Delta\phi$ due to the inhomogeneity of the field Bo in the sample, where $\Delta\phi\beta$ is the phase delay due to the total inhomogeneity.

According to a broad aspect of the present invention it is an object thereof to provide a method for determining a map of the local inhomogeneity within the sample.

Accordingly, it is an object of the present invention to acquire separate data contributions from first and second spectral components. The object includes having the data corrected for the phase delay $\Delta\phi$ due to the inhomogeneity of the field within the sample as well as due to linear phase delays $\beta$. The data may be acquired with a single scan and in sufficient quantities to construct an image of each of the spectral components, a combined image without chemical shift artifacts and/or a sample inhomogeneity map.

BRIEF DESCRIPTION OF THE INVENTION

In accordance with the present invention a method of using magnetic resonance imaging (MRI) systems for acquiring separate data contributions in images derived from first and second spectral components in sample is provided, said images comprised or pixels corresponding to spatially defined sections in the selected portions of the sample, said method comprising the steps of:
acquiring Rf signals using a scan sequence that generates at least two echoes,
said Rf signals each comprised of combination echoes, the combination echoes including data contributions from the first and second spectral components,
determining linear phase delays ($\beta$) of said RF signals caused by such things as instrumentation phase delays,
said acquiring step including:
causing a 90 degree phase difference between the data contributions of the spectral components in the first of said at least two echoes;
causing a known phase difference between the data contributions of the spectral components in the second of said at least two echoes,
processing the acquired echo signals from the first and the second echoes to determine an approximate phase delay $\Delta\phi$ due to sample cause inhomogeneity, and
using the determined phase delays $\Delta\phi$ and $\beta$ to calculate the separate data contributions of each of said spectral components for each pixel.

A related feature of the invention includes causing a 360 degree phase difference between the data contribution of the spectral components in the second of said at least two echoes.

Still another feature of the invention comprises causing the spectral components to be separated by a first angle in one of at least two echoes and by a second angle in another of said at least two echoes, where the difference between said first angle and said second angle is substantially 180 degrees.

According to another related feature of the invention the phase differences between the spectral components in the first and second echoes can be approximately 90 and 270 degrees, respectively.

A feature of the invention includes using scans comprised of Hahn echo and gradient echo sequences to acquire echo data.

Another feature of the invention includes using scans consisting of gradient echo sequences to acquire the echo data.

A further feature of the invention comprises displaying separate images of the first and second spectral components using each of the separate contributions of the first and second spectral components in pixels corresponding to each of the spatially defined sections.

Another feature of the invention is the use of the method with the first and second spectral components being a lipid and water respectively.

Yet another feature of the invention includes positioning the 180 degree Rf pulse to cause a 90 degree phase difference between the data contributions of the first and second spectral components in one of the echoes.

Yet another feature of the invention comprises positioning the 180 degree Rf pulse to cause a 270 degree phase difference between the data contributions of the first and second spectral components in the other of the echoes.

Still another feature of the invention includes using at least three echoes where the echoes following the second echo are used to aid in determining the relative decay of the angle $\psi$ between the major spectral component amplitude and the image amplitude per pixel to correct an approximate inhomogeneity map for the errors due to differences in the decay characteristics of said two spectral components.

According to still another feature of the invention two scans are used. The same echo time TE is used in each scan. In one scan the 180 degree Rf pulse or pulses are applied to cause substantially a 90 degree phase difference between the data contribution of the first and second spectral components while in the second scan at least one of the 180 Rf pulses are applied to cause substantially a 270 degree phase difference. From the "simultaneous" 90 and 270 degree phase differences in the two scans, the spectral components and the inhomogeneity map are readily available. Since there is no time difference between the echo time of the echoes that provide 90 degree and 270 degree there is no error due to such a time difference.

Yet another feature of the invention assures that no phase angle discontinuities (jumps of over essentially 360 degrees) occur in the inhomogeneity map.

BRIEF DESCRIPTION OF THE DRAWINGS

The above mentioned and additional objects and features of the present invention will be best understood when considered in the light of the following description of a broad aspect of the invention taken in conjunction with the accompanying drawings, wherein:

FIG. 3 is a vector showing of results obtained using the sequence of FIG. 2;

FIG. 5 is a block diagram details of the phase jump detector corrector of FIG. 4, and FIG. 5a is a truth diagram for the contiguity gate 116 of FIG. 5.

GENERAL DESCRIPTION

Figure 1:
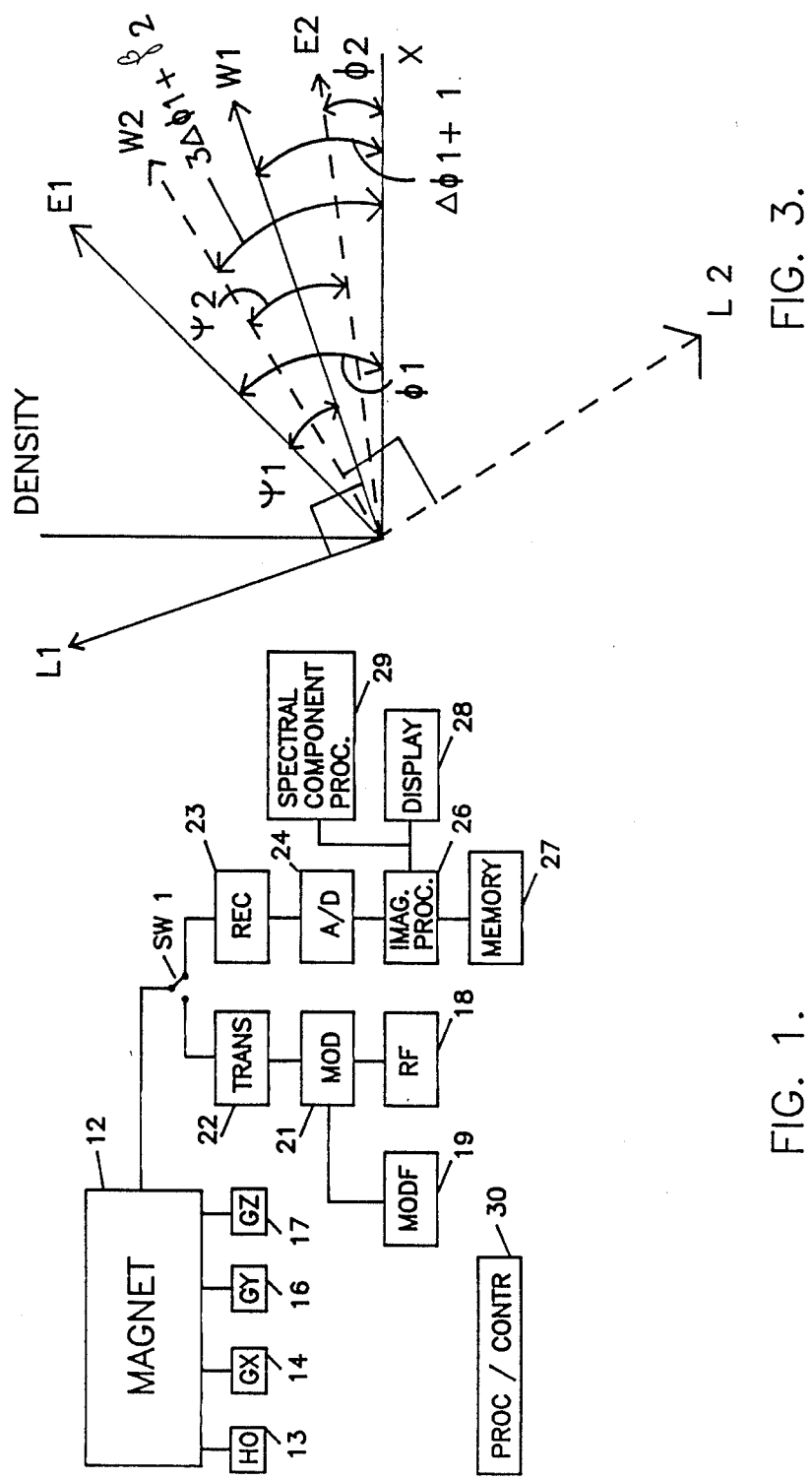
FIG. 1 is a typical MR data acquisition system.

FIG. 1 generally shows an MRI system 11 for use in acquiring data and providing images using magnetic resonant principles. The system includes a large static magnet 12 into which the patient (or sample) is placed. The static magnetic field can be generated using electro-magnets, permanent magnets or superconducting magnets within the scope of this invention. In a preferred embodiment, a superconducting magnet is used. The energization of the superconducting magnet is indicated at 13 by the magnetic field generating block Ho.

Means are provided for locating the source of signals received. More particularly gradient fields are applied to the static magnetic field. These gradients are applied in the X, Y, and Z cartesian coordinates. Gradient generators are indicated at blocks 14, 16 and 17 labelled Gx, Gy and Gz respectively. The gradients are used to vary the magnetic fields along the X, Y, and Z axes and thus provide slice selection, encoding and view selection functions.

The large static magnetic field causes an alignment of certain nuclear spins in the sample (or patient). Means are provided subsequently for perturbing the aligned spins by applying radio frequency pulses at the Larmor frequency of the particular nuclei being nutated. The Larmor frequency is:

$$fl = \gamma Bo / 2\pi$$

$\gamma$ is the gyromagnetic constant for the isotope whose nuclei is perturbed, $\pi$ is the constant 3.1416, and Bo is the strength of the static field at the location of the nuclei.

The Rf pulse is generated in the Rf generator 18. The pulse may be shaped by modulating it with a shaped signal generated at modulation signal generator 19. The shaped signals and the Rf pulses are applied to the modulator 21. The modulated shaped Rf pulses are then transmitted by the transmitter amplifier 22 through switch SW 1 to Rf coils in the main magnet assembly 12. It should be understood that for purposes of this invention it is not necessary to shape the Rf signals.

In echo sequences, after the passage of a set amount of time from the end of the Rf pulse, echo signals are generated. The echo signals may be Hahn echo and gradient echo signals or just gradient echo signals with appropriate phase differences between the spectral components. The echoes are received by the receiver 23 using either the same Rf coils used during transmission or using separate Rf pick-up coils. In either case, the received signals are amplified and digitized by the analog to digital (A/D) circuitry indicated at 24. The amplified digitized signals may be processed in processor 26 in conjunction with memory means 27 to obtain pixel values or images for display on the monitor 28.

In accordance with this invention a spectral component and/or inhomogeneity map processor 29 is provided. The processor 29 uses the pixel values to obtain spectral component values per pixel and/or inhomogeneity values per pixel. The spectral component processing and inhomogeneity processing is hereinafter sometimes referred to as "spectral component processing".

The acquisition processing, imaging and spectral component processing operations are under the control of the processor controller 30. The processor controller 30 provides the control signals and times for the particular scan sequences used in acquiring data, for example. It controls all of the blocks shown and thus is connected to each of the blocks. To avoid confusion the busses between the processor-controller 30 and the other blocks are not shown.

When acquiring data for images using protons, for example, artifacts are often generated because of what are known as chemical shifts. The chemical shifts are caused by the differences in the resonant frequencies of the hydrogen nuclei attached to different molecules. For example hydrogen attached in a water molecule has a slightly different Larmor frequency than hydrogen in a lipid molecule. The differences in frequencies due to the chemical shifts produce actual spatial shifts which cause artifacts in the images. However, the chemical shift can also be used to obtain additional data, such as for example, data which quantifies the amount of fatty substances in body tissues and thus, the additional data can be useful.

Figure 2:
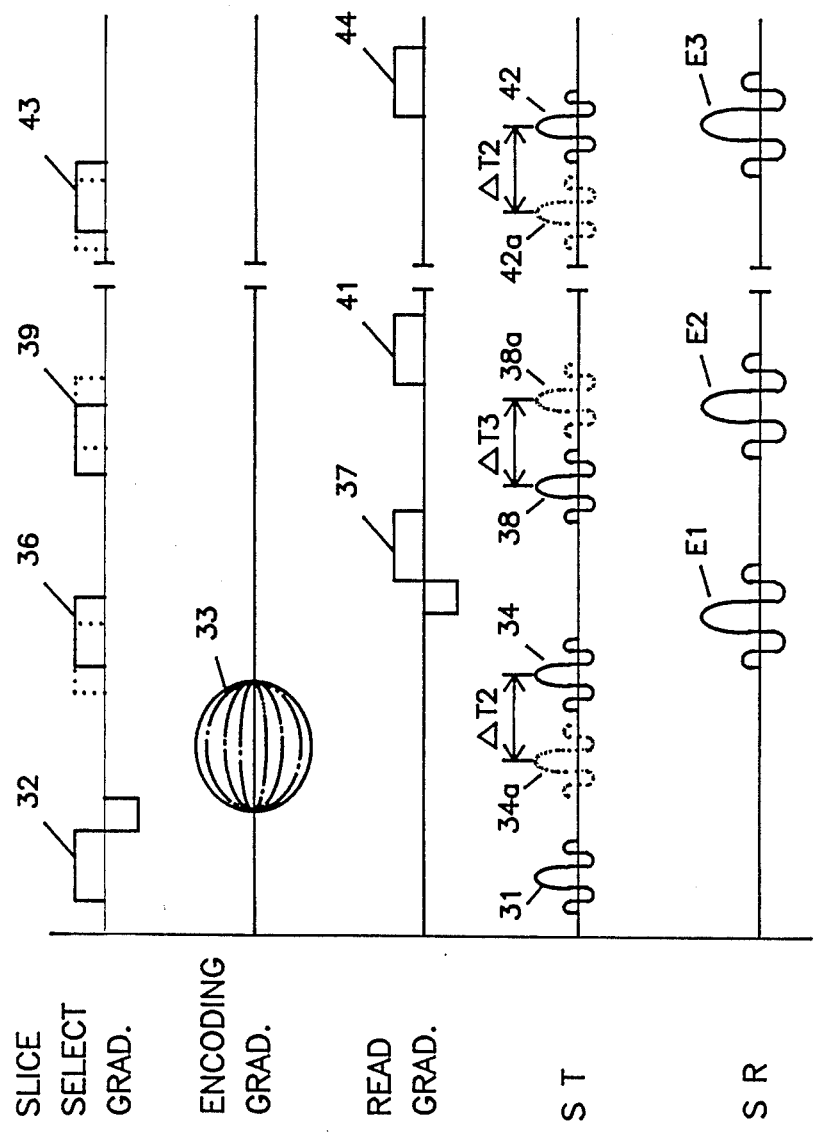
FIG. 2 is a showing of a data acquisition sequence as described herein for obtaining imaging data of two spectral components in at least a single scan.

FIG. 2 shows a sequence wherein data from both first and second spectral components and an inhomogeneity map can be obtained, in one scan. This is done in a preferred embodiment by shifting the two 180 degree Rf pulses by amounts to satisfy any one of the following sets of equations:

$$1\begin{cases} \Delta T2 = \tfrac{1}{8}v \\ \Delta T3 = \tfrac{3}{8}v \end{cases} \quad 3\begin{cases} \Delta T2 = -\tfrac{1}{8}v \\ \Delta T3 = \tfrac{3}{8}v \end{cases}$$

$$2\begin{cases} \Delta T2 = -\tfrac{1}{8}v \\ \Delta T3 = -\tfrac{3}{8}v \end{cases} \quad 4\begin{cases} \Delta T2 = \tfrac{1}{8}v \\ \Delta T3 = -\tfrac{3}{8}v \end{cases}$$

where $v$ is the chemical frequency shift between spectral components.

In the case of sets 1 and 2 the spectral components are separated by plus 90 degrees and plus 270 degrees. In the case of sets 3 and 4 the separation is by negative 90 and negative 270 degrees. It should be noted that image data for the spectral components plus for an inhomogeneity map can be obtained if the difference between the angles between the spectral components from the first and the second echo is 180 degrees or an integer multiple thereof.

The result of shifting the 180 degree Rf pulses is an echo signal that includes a first spectral component W1 (water for example) and a second spectral component L1 (lipids for example). The first and second spectral components are preferrably separated by 90 degrees and 270 degrees. With this separation the contributions of the spectral components can be aligned with the real and imaginary components of the complex numbers and manipulated to provide the value of each of the spectral components per pixel and the inhomogeneity per pixel in the sample with a minimum of calculations.

As illustrated in the embodiment of FIG. 2 a 90 degree pulse 31 is transmitted during the transmission of a slice selecting gradient 32. Subsequently a phase encoding gradient pulse 33 is transmitted to acquire data for the selected encoding gradients. In the usual spin echo scan sequence the 180 degree Rf pulse is applied so that the Hahn echo and the gradient echo coincide. This usual position for the 180 degree Rf pulse is shown in dotted line form at 34a. In accordance with the invention the 180 degree Rf pulse 34 is applied at a time $\Delta T2$ removed from the usual location.

The first 180 degree Rf pulse is applied during the application of a slice selecting gradient 36. The time $\Delta T2$ is selected to enable the spectral components to separate by substantially 90 degrees. A read gradient 37 is applied to coincide with the receipt of the echo signal E1.

A second echo E2 is acquired using a transmitted pulse moved an amount $\Delta T3$ from the normal location of the pulse shown at 38a where it would cause the Hahn echo to coincide with the gradient echo. The time shift $\Delta T3$ is selected to cause a 270 degree phase difference between the spectral (water and the lipid) components Ew2 and El2. The Rf pulse 38 coincides with a slice selecting gradient pulse 39 and a read gradient pulse 41 is applied during the receipt of the second echo signal E2.

Vectors representing the received echoes are shown in FIG. 3. The first echo's water contribution W1 is shown removed from the real axis by $\Delta\phi1$ plus $\beta1$ degrees. The resultant echo due to the contribution of lipid and of water is shown as the vector E1 removed from the real axis by an angle $\phi1$. The data can be described as having real and imaginary components, i.e. from the first echo:

$$W1 = E1\cos\psi1 \qquad (1)$$

$$L1 = E1\sin\psi1 \qquad (2)$$

$$TAN\psi1 = L1/W1 \qquad (3)$$

with $\psi1 = \phi1 - \beta1$ and $$E1 = (W_1^2 + L_1^2)^{\frac{1}{2}} \qquad (4)$$

where:
W1 is the water contribution to the echo E1,
L1 is the lipid contribution to the echo E1,
E1 is the resultant echo signal obtained by the image processor,
$\phi1$ is the angle between a resultant echo (E1) and the real axis,
$\psi1$ is the angle between the water and the resultant echo
$\Delta\phi1 + \beta1$ is the angle between the measured water contribution and the real axis.

The angle $\beta1$ is a linear function of location caused by such things as instrumental characteristics and the misalignment of the sampling center and the echo peak. The angle $\beta$ may be measured for example by obtaining data without encoding and with the $\Delta T=$) i.e. with the Hahn and the gradient echoes coinciding. Then, the phase angle $\Delta \textcircled{R}$ equals zero and the phase angle of the density signal is $\beta$. An alternative method is to fit the acquired phases $\phi$ to a two dimensional linear function. The value of the fitted function per pixel is the value of $\beta$.

The angle $\Delta\phi$ is determined in a preferred embodiment, according to the present invention, by causing a phase difference of 270 degrees derived from a second echo between the water and the lipid signals between the water and lipid signals derived from the first echo in addition to the phase difference of 90 degree. In which case, the total image phase difference $\phi2$ of the second echo is equal to $-\psi2 + 3\Delta\phi + \beta2$. Thus, the total phase angle $\phi1$ (i.e. $\psi1 + \Delta\phi1 + \beta1$) of the first image and the total phase angle $\phi2$ of the second image added together gives $\psi1 - \psi1 + 4\alpha\phi + \beta1 + \beta2$. Since $\psi1$ is assumed to equal $\psi2$ and $\beta1$ and $\beta2$ are known the result is that $4\Delta\phi$ equals the known $\phi1 + \phi2$. Thus, the value of $\alpha\phi$ is readily obtained. Once the value of $\Delta\phi$ is obtained, then the angle $\psi$ is readily available as equal to $\phi - \alpha\phi - \beta$.

The system provides an inhomogeneity map i.e. the values of $\Delta\phi$. It should be recognized of course that $\psi$ is slightly different for each experiment because of the different decays due to different T2's. Thus the value obtained when subtracting $\psi1$ and $\psi2$ as determined by the measurement is not exactly zero. However, in actual practice the error is less than the measurement error.

A third echo E3 can be acquired as one method of determining a more exact $\Delta\psi$(i.e. $\psi1 - \psi2$). The third echo is shown in FIG. 2. It provides data which can be useful for correcting the error in $\Delta\psi$ due to the different transverse relaxation times of fat and water. The third echo as shown in FIG. 2 is obtained responsive to the application of another 180 degree Rf pulse 42 shown shifted from its usual location indicated by dotted line pulse 42a an amount $\Delta T2$. The shift causes the phases of the water and lipid components of the echo E3 to be separated by 90 degrees. The Rf pulse 42 is applied during a slice selecting gradient pulse 43 and the read gradient pulse 44 is applied to overlap the receipt of echo E3. The extra echo has an angle $\phi3$ equal to $\psi3 + \Delta\phi1 + \beta3$. The difference between the measured phase angles $\phi1$ and $\phi3$ is the difference $\psi1 - \psi3$. The difference $\psi1 - \psi2$ can thus be computed by interpolation and the inhomogeneity map made using only two echoes can be corrected. More echoes could of course be used to refine the interpolation results.

According to an alternative embodiment of the invention, two separate scans are used. In one scan an echo preferably the second echo, is manipulated as described to cause a 90 degree phase delay between spectral components. In the second scan using the same TE (echo time) as in the first scan, the same echo that was manipulated to cause a 90 degrees phase delay which is now manipulated to cause a 270 degree phase delay between the spectral components. The method of this embodiment avoids the error due to the decay of the angle $\psi$.

Figure 4:
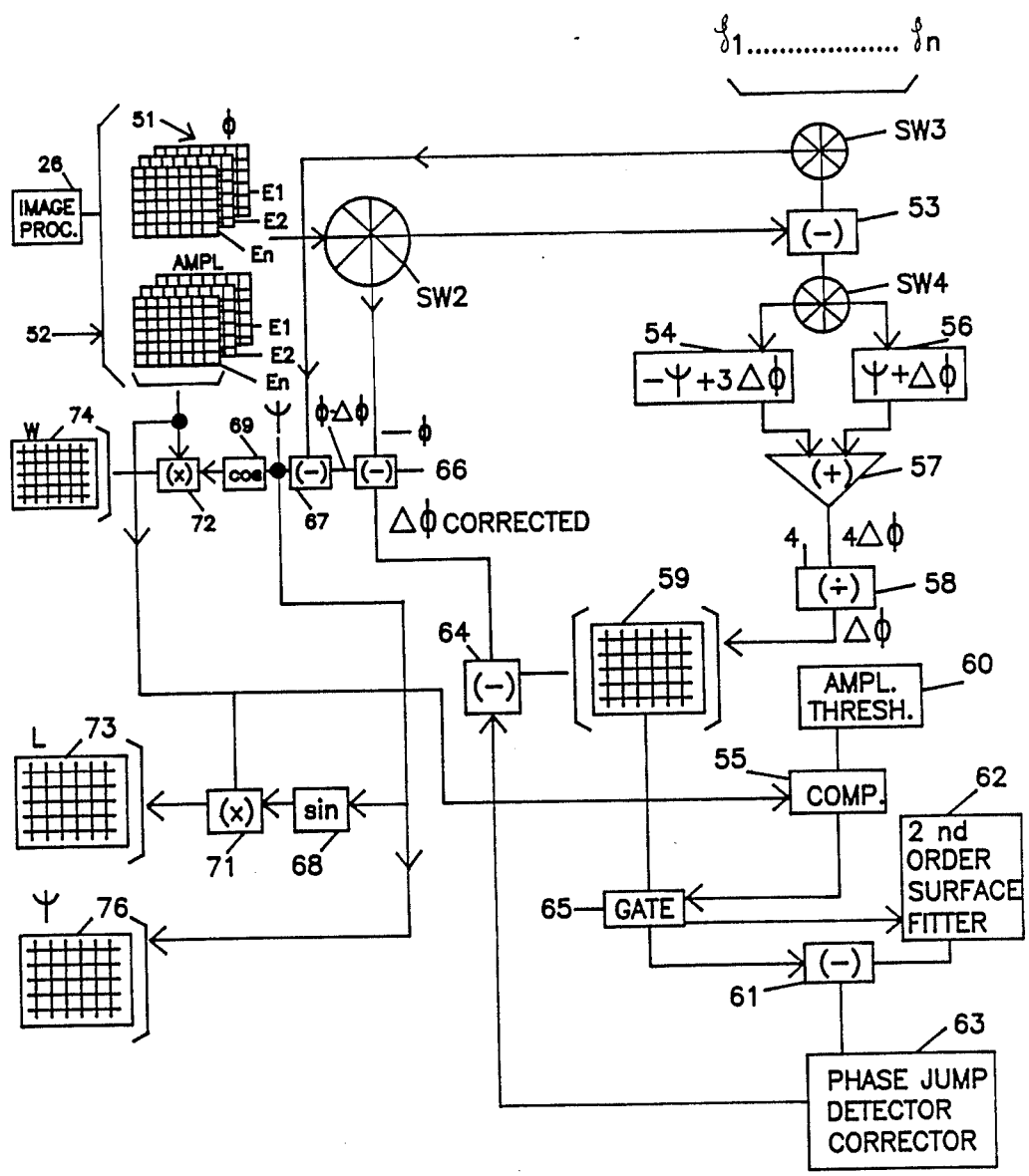
FIG. 4 is a block diagram showing details of the spectral component and/or inhomogeneity map processor 29 of FIG. 1.

FIG. 4 shows the inventive concept in block diagram form. More particularly as shown in FIG. 4 the image processor 26 provides data to the spectral component processor 29. The spectral component processor comprises matrix memory units in which the values of the phase angle $\phi1,\phi2\ldots\phi n$ and the amplitudes E1, E2 ... En are stored The memory matrix for the phase angles are shown at 51 and the memory matricies for the amplitude are shown at 52. The phase angle data is read out and transmitted through a switch means SW2 to subtraction unit 53.

Simultaneously therewith and coordinated therewith the values $\beta1$ to $\beta n$ are transmitted through switch SW3 to subtraction unit 53. The switch means SW2 and SW3 are coordinated so that the data of $\phi1$ coordinates with the data of $\beta1;\phi2$ coordinates with $\beta2$, etc. Thus, the output of the subtraction unit 53 is the difference between the phase angles $\phi N$ and $\beta N$ when the angle between the spectral components are 90 degrees and 270 degrees and where N is a positive integer.

The outputs of the subtraction unit 53 are $-\psi + 3\Delta\phi$ and $\psi + \Delta\phi$ which are transferred as indicated at blocks 54 and 56 respectively by switch SW4. The contents of blocks 54 and 56 are added in add unit 57 to give $4\Delta\phi$. The value $4\Delta\phi$ is input into divide unit 58 as a dividend with 4 as a divisor. The quotient output of divide unit 58 ($\Delta\phi$) is stored in memory 59. The memory unit 59 is the inhomogeneity map.

Means are provided to correct for "wrap-around" in the inhomogeneity map. More particularly, the angle Δφ map contains phase angle discontinuities—that is jumps of 360 degrees. To correct such discontinuities, the angles in memory 59 are fitted to a second order surface subtracted in subtract unit 61 from the second order surface supplied by the second order surface fitting unit 62. The difference will be substantially smooth surface except where there are phase angle jumps or discontinuities. The phase jump detector-corrector unit 63 detects variations in the smooth surface and directs a 360 degree correction value to subtract unit 64 where the 360 degree phase jump correction value is subtracted from the corresponding angular values of unit 59 to thereby accomplish phase unwrapping; i.e., correct Δφn for the phase jumps.

The main problems involved in detecting phase jumps in order to accomplish phase unwrapping are, that:

a. the phase jumps are spread over a number of pixels;

b. in the vicinity of each phase jump the gradients are fairly high and in the opposite direction to the phase jump;

c. in low-signal areas the phase is determined by the noise rather than the signal, and d. the line of phase jumps (the border between the high phase and the low phase) may be at an acute angle to the direction of search, which spreads the phase jump over many more pixels.

Thus, in the prior art the detection of phase jumps by looking at differences or derivatives often does not work. There are two kinds of errors in the prior art phase jump detection systems; they are:

a. errors of ommission (failures to detect phase jumps) caused because the differences are too small (e.g.—the actual difference between two neighboring pixels is the fraction of the phase jump caused by the spread of the jump). While the jump fraction increases if the difference between the pixels increases, so does the opposite gradient difference; and b. false detections caused because noise induced local differences are large gradient differences which masquerade as phase jumps. False detections also occur when a single phase jump has been spread over several pixels, and the differences between several adjacent pixels exceed the threshold used to aid in determining these phase jumps.

Changing the threshold does not help as raising it, say, reduces the number of false detections but at the same time increases the number of ommissions.

Previous attempts at phase jump detection have used phase jump tracking methods that look for continuity breaks. These approaches are time consuming. The phase detection and correction method of unit 63 uses a minimum of tests for each pixel and tests the pixels in regular order used in the imaging device for example, raster scanning.

In general, the system of FIG. 4 removes the linear phase angle component from the phase images of each echo in unit 53. The phase images of each echo are then summed in unit 57 as a step in obtaining the inhomogeneity map at unit 59. The inhomogeneity map is then fitted in the high signal area (amplitude above the certain threshold as determined by comparator 55 and amplitude threshold 60) to a second order surface as indicated at unit 62. The second order surface is subtracted from the fitted inhomogeneity map in unit 61 to obtain a modified inhomogeneity map.

The modified inhomogeneity map from subtract unit 61 goes to the phase jump detector corrector unit 63.

Details of an embodiment of unit 63 are shown in FIG. 5.

As shown therein, means are provided to set the values of the modified inhomogeneity map in the low signal areas to twice the angular value of water in the system. By setting the low angular values to twice the value of water false detections of phase angle jumps outside the actual image such as the jump between the subject and air are effectively limited. Alternatively the value of the low signal pixels can be set to the fitted surface value.

In the embodiment of FIG. 5 the unit 63 includes a comparator 102 which compares the amplitude values of the echoes of store 52 to the amplitude threshold shown at 60, for example to determine "low" signal areas. A low amplitude phase setter 104 then sets the angles of the modified inhomogeneity map from unit 61 at twice the value of water as indicated at 103.

Means are provided for predicting the value of the next pixel in the modified inhomogeneity map obtained from unit 104. As shown therein predictors 105, 106 and 107 are used to approach each pixel as it is scanned in three directions, all within 90 degrees of the direction of scan. In a preferred embodiment, the directions 0, 45 and −45 degrees from the scan direction are used to assure having at least one predictor that is close to perpendicular to any phase jump denoting line.

Alternatively the predictor can approach each pixel in the direction of the gradient vector. In a preferred embodiment extrapolation is used for predicting, and at the border pixels, the border pixel values are used as the predicted values.

Comparators 108, 109 and 110 compare the actual pixel values with the predicted pixel values to determinne prediction errors. The largest of the errors in absolute value is selected by maximum selector unit 111. The unit 111 also provides the sign plus or minus of the largest error. The largest errors are compared with threshold value indicated at 112 in comparator 113. When the error exceeds the threshold then a phase jump has been detected. (This threshold is a known value greater than "normal" jumps in the phase).

The output from unit 113 is a "1" or a "0" indicating a phase jump or no phase jump, respectively. The phase jump indications are then reduced or thinned by cancelling all such indications from more than a solitary pixel to mark the phase jump line.

In greater detail, means are provided for mapping the phase jumps by marking all pixels with the accumulated number of phase jumps encountered during this scan until each pixel is reached during the scan. More particularly, the output of the comparator 113 (1 or 0) is delayed in unit 114. The delayed output is connected to a contiguity gate 116 along with the present output. The two inputs to the gate 116 operate the gate according to the Truth Table of FIG. 5a. As long as the present input is "0" the output is "0". If the present input is +1 and the previous input is 0 or −1, the output is +1. If the present input is −1 and the previous input is 0 or +1, the output is −1. The signed 1 outputs of the contiguity gate 116 are accumulated in unit 117 and the accumulated values are multiplied on a per pixel basis by 360 degrees in multiplication unit 118 to correct the map 59. The product is subtracted from the phase angle values of map 59 in unit 64 to provide "unwrapped" inhomogeneity map values Δφ as indicated in FIGS. 4 and 5.

The corrected $\Delta\phi n$ is then subtracted from the appropriate values in subtract unit 66 to provide a difference $\phi n - \Delta\phi n$. The appropriate value $\beta n$ is subtracted in unit 67 from this difference to give the value as inputs to sin operator 68 and cos operator 69. The sin and the cos are multiplied by the appropriate echo amplitude Ew in multiply units 71 and 72 respectively to give the values of the two spectral components L per pixel and W per pixel in stores 73 and 74 respectively. The values of $\psi$ per pixel may also be stored in memory 76.

In operation, a second echo is acquired with $\Delta T3$ being equal to $\frac{3}{4}v$. This separates the spectral components by 270 degrees and enables obtaining the values of the total echo Es and the values of the spectral components W1 and L1. The linear phase angle $\beta$ caused instrumentation phase delays is previously measured. In this manner $\psi$, $\phi$, $\Delta\phi$, W, L, are all made available.

Accordingly a unique data acquisition method is provided. The method enables the acquisition of more diversified data in either a single scan or in two scans than was previously provided. The data can be used for separate spectral component imaging, for correcting and reducing chemical shift artifacts and for providing an inhomogeneity map corrected for phase angle discontinuities.

While the invention is described with regard to specific examples it should be understood that these examples are not given as limitations on the scope of the invention but merely as exemplary embodiments of the invention.

What is claimed is:

1. A data acquisition method of acquiring separate first and second spectral data contributions to magnetic resonance images derived from first and second spectral components and for also simultaneously producing an inhomogeneity-map of a sample being imaged during a single magnetic resonance imaging (MRI) scan, said images comprised of pixels corresponding to defined sections in selected portions of said simple, said method comprising the steps of:

measuring a phase angle $\beta$ due to linear phase delays between a major spectral component and the horizontal axis of a Cartesian coordinate system, during occasional calibration scans, acquiring data of the sample from echoes obtained using a gradient echo scan sequence simultaneously with a Hahn echo scan sequence;

shifting the Hahn echo with respect to the gradient echo to separate the two spectral components by 90 degrees and to obtain a first echo of amplitude E, that is a resultant of data for each of said two spectral components separated by the 90 degrees;

said simultaneous Hahn and gradient echo span sequences providing the first echo amplitude E, and a phase angle $\phi 1$ between the first echo and the horizontal axis in the Cartesian coordinate system;

said angle $\phi$, being equal to the angle $\psi 1 + \Delta\phi + \beta$ where the angle $\psi 1$ is the angle between the first echo and the major spectral component W, of the two spectral components, $\Delta\phi$ is the phase angle between the major spectral component W1 and the horizontal axis due to the inhomogeneity of the sample, and $\beta$ is the phase angle between the major spectral component W1 and the horizontal axis due to system caused linear phase delays, again shifting the Hahn echo with respect to the gradient echo to separate the two spectral components by $n \times 90$ degrees where n is any odd integer but not one or zero to obtain a second echo of amplitude E2 that is the resultant of data for each of the two spectral components and a phase angle $\phi 2$ between the second echo and the horizontal axis, said angle $\phi 2$ being equal to the angle $-\psi 2 + n\Delta\phi + \beta$ where: the angle $\psi 2$ is the angle between the second echo and the major spectral component W2 and is practically equal to $\psi 1$, the angle $n\Delta\phi$ is the angle between the major spectral component W2 and the horizontal axis and where $\beta$ is the phase angle between the major spectral component and the horizontal axis due to system caused linear phase delays, computing sample inhomogeneity caused phase shift per pixel $\Delta\phi$, said computing step comprising the steps of:

summing the per pixel phase angles between said first echo and the horizontal axis $\phi 1$ and between the second echo and the horizontal axis $\phi 2$ to obtain the sum $(n+1)\Delta\phi + 2\beta$, subtracting twice the linear phase delay ($2\beta$) of the system, dividing the difference $(n+1)\Delta\phi$ by $(n+1)$ to obtain the per pixel sample caused inhomogeneity caused phase shift $\Delta\phi$, mapping the obtained values of $\Delta\phi$ to provide an uncorrected sample caused inhomogeneity map, correcting said uncorrected sample caused inhomogeneity map for phase jumps to provide a corrected sample caused inhomogeneity map having corrected values of $\Delta\phi$ per pixel, computing the angle $\psi$ between the resultant echoes E1, E2 and the main spectral components W1, W2, respectively, using the corrected values, using the value $\psi$ to compute the amplitudes of each of the spectral components per pixel according to the equations E1 cos $\psi$=W1 E2 cos $\psi$=W2, E1 sin $\psi$=L1 and E2 sin $\psi$=L2, said step of correcting said sample caused inhomogeneity map including the steps of:

fitting said uncorrected sample caused inhomogeneity map to a second order surface, subtracting said second order surface from said fitted uncorrected sample caused inhomogeneity map to provide a modified sample caused inhomogeneity map, detecting phase jumps in said modified sample caused inhomogeneity map, assigning each pixel having a determined phase jump a positive or a negative unity value depending on the direction of the detected phase jumps, accumulating the values assigned to each pixel having a determined phase jump therein during a scan of the modified phase map, multiplying the accumulatdd values for each pixel by 360 degrees, and subtracting at each pixel the product of the accumulated value at the pixel multiplied by 360 degrees from the value of the map at the same pixel to correct the pixel for phase jump.

2. The method of claim 1 wherein the step of shifting the Hahn echo with respect to the gradient echo comprises using an RF pulse removed from a position for causing the Hahn echo to coincide with the gradient echo by an amount substantially equal to $\frac{1}{4}\eta$ where $\eta$ is the chemical frequency shift between said spectral components.

3. The method of claim 2 including the step of correcting the phase difference for errors due to decays occurring during the time taken to obtain the echoes, said correcting step including interpolating between the echoes.

4. The method of claim 1 wherein the step of determining the linear phase delay per pixel comprises using a non encoding scan wherein the Hahn echo and the gradient echo coincide.

5. The method of claim 1 wherein the step of detecting phase jumps in said modified sample caused inhomogeneity map comprises the steps of:
searching the modified sample inhomogeneity map in a direction substantially normal to any phase jump line on the map to determine jumps and the positive or negative direction of the determined jumps, and eliminating jumps between the subject and air.

6. The method of claim 5 wherein said searching step includes searching in at least three directions, said directions being within plus 90 to minus 90 degrees to the direction of the scanning.

7. The method of claim 6 wherein the searching step includes searching in a direction substantially along the spatial gradient of $\Delta\phi$.

8. The method claim 7 wherein the step of searching in a direction comprises the steps of:
predicting the pixel value,
determining the prediction error and the direction of the prediction error,
comparing the error to a threhsold, and
choosing one of a contiguous number of pixels exceeding the threshold as a pixel containing a jump, and
using the direction of the error as the direction of the jump.

9. A system for acquiring separate first and second spectral data contributions per pixel for a magnetic resonance image, said data contributions being derived from first and second spectral components, said acquisition occurring during a single magnetic resonance imaging (MRI) scan, said image comprised of pixels corresponding to a spatially defined region in portions of a sample, said system also simultaneously providing an inhomogeneity map of the sample being imaged, said system comprising:
means for determining linear phase delay angles $\beta$ caused by the system during occasional calibration scans,
means for acquiring data of the sample from echoes obtained using a gradient echo scan sequence simultaneously with a Hahn echo scan sequence,
means for shifting the Hahn echo with respect to the gradient echo to obtain a first echo that is resultant of data from each of the said two spectral components separated by 90 degrees,
means for acquiring data corresponding to the amplitude E1 of the first echo and the phase angle $\phi 1$ between the first echo and a horizontal axis in a Cartesian coordinate system,
means for again shifting the Hahn echo with respect to the gradient echo to obtain a second echo that is the resultant of the data from each of the said two spectral components separated by n(0 degrees, where n is any odd integer not zero or one,
means for acquiring data corresponding to the amplitude E2 of said second echo and the phase angle $\phi 2$ between the second echo and the horizontal axis,
means for computing the sample inhomogeneity caused phase shift per pixel $\Delta\phi$,
said means for computing $\Delta\phi$ comprising:
computing means for summing the pixel phase angle between said first echo and the horizontal axis $\phi 1$ and between the second echo and the horizontal axis $\phi 2$, where:

$$\phi 1 = \psi 1 + \Delta\phi + \beta$$

and $$\phi = -\psi + n\Delta\phi + \beta$$

giving the sum: $(n+1)\Delta\phi + 2\beta$ where:
$\psi \approx \psi 2$
$\psi 1$ is the phase angle between the echo E1 and the major spectral component W1, and
$\psi 2$ is the phase angle between the echo E2 and the major spectral component W2,
means for subtracting twice the said linear phase delay of the system 2 $\beta$ from the sum, the value of $\beta$ being obtained during occaional calibration scans, to give the difference $(n+1)\Delta\phi$,
means for dividing the difference $(n+1)\Delta\phi$ by $(n+1)$ to obtain the per pixel sample inhomogeneity caused phase shift $\Delta\phi$,
means for computing the angle $\psi 1$ between the resultant echo E1 and the spectral component W1,
means for using the value of $\psi 1$ to compute the amplitudes of each of the spectral components per pixel $W1 = E1 \cos\psi$, $L1 = E1\sin\psi$, $W2 = E2\cos\psi 2$, $L2 = E2\sin\psi 2$, and
means for correcting the computed values of $\Delta\phi$ for phase jump discontinuities.

10. The system of claim 9 wherein the means for shifting the Hahn echo with respect to the gradient echo to obtain said first echo comprises:
means for providing an RF pulse removed from a position for causing the Hahn echo to coincide with the gradient echo by an amount substantially equal to $\frac{1}{2}\eta$ where $\eta$ is the chemical shift frequency between said spectral components, and
wherein the means for shifting the Hahn echo with respect to the gradient echo to obtain said second echo comprises:
means for applying an RF pulse removed from a position for causing the Hahn echo to coincide with the gradient echo by an amount substantially equal to $\frac{1}{2}\eta$, where $\eta$ is any odd integer except 0 and 1.

11. The system of claim 10 including correcting means for correcting the sample caused inhomogeneity phase data for phase jumps comprises:
means for setting the $\Delta\phi$ values per pixel into a phase map,
means for fitting the phase map to a second order surface,
means for subtracting the second order surface from the $\Delta\phi$ phase map to obtain a modified $\Delta\phi$ phase map,
means for searching the modified $\Delta\phi$ phase map in a direction substantially normal to any phase jump line on the map to determine phase jumps and the positive or negative directions of the jumps, means for eliminating the jumps between the sample and air,
means for assigning each pixel having a determined jump therein a positive or negative unity value depending on the direction of the jump,
means for accumulating the said unity values assigned to each pixel during a scanning of the modified phase map, and
means for correcting for the phase jumps by subtracting at each pixel the product of the accumulated value at the pixel multiplied by 360 degrees from the value of the same pixel on the map.

12. The system of claim 11 wherein the means for searching the determined phase jumps in a direction comprises:
means for predicting the amplitude value per axial,
means for determining prediction error and the direction of the prediction error,
means for comparing the error to a threshold, and
means for choosing one of a contiguous number of pixels exceeding the threshold as a pixel containing a jump with the direction of the error being the direction of the jump.

* * * * *